(12) United States Patent
Giri et al.

(10) Patent No.: US 10,061,006 B2
(45) Date of Patent: Aug. 28, 2018

(54) SYSTEM AND METHOD FOR ACCELERATED ANGIOGRAPHIC MAGNETIC RESONANCE IMAGING

(71) Applicants: Siemens Healthcare GmbH, Erlangen (DE); NorthShore University HealthSystem, Evanston, IL (US)

(72) Inventors: Shivraman Giri, Chicago, IL (US); Robert R. Edelman, Highland Park, IL (US); Ioannis Koktzoglou, Des Plaines, IL (US)

(73) Assignees: Siemens Healthcare GmbH, Erlangen (DE); Northshore University Healthsystem, Evanston, IL (US)

( * ) Notice: Subject to any disclaimer, the term of this patent is extended or adjusted under 35 U.S.C. 154(b) by 392 days.

(21) Appl. No.: 15/053,009

(22) Filed: Feb. 25, 2016

(65) Prior Publication Data

US 2017/0248670 A1  Aug. 31, 2017

(51) Int. Cl.
*G01R 33/56* (2006.01)
*G01R 33/563* (2006.01)
*G01R 33/561* (2006.01)

(52) U.S. Cl.
CPC ...... *G01R 33/5635* (2013.01); *G01R 33/5611* (2013.01); *G01R 33/5613* (2013.01)

(58) Field of Classification Search
CPC ............ G01R 33/5635; G01R 33/5673; G01R 33/5602; G01R 33/56325; G01R 33/56366; G01R 33/5676; G01R 33/4824; G01R 33/4826; G01R 33/5601; G01R 33/5608; G01R 33/56341; A61B 5/055; A61B 5/0044; A61B 5/0263; A61B 5/0402; G06T 2207/10076; G06T 2207/30104; G06T 7/0016
See application file for complete search history.

(56) References Cited

U.S. PATENT DOCUMENTS 8,169,218 B2 * 5/2012 Nezafat .............. G01R 33/5635 324/309
8,457,711 B2 * 6/2013 Nezafat .............. G01R 33/5635 600/407

(Continued)

OTHER PUBLICATIONS

Pereles et al, Time-resolved MR Angiography.*

(Continued)

*Primary Examiner* — Clayton E Laballe
*Assistant Examiner* — Ruifeng Pu (57) ABSTRACT

A magnetic resonance method and system are provided for projection MR imaging of vascular structures within a subject, with scan times that are shorter than those needed for conventional techniques. Image acquisition sequences are synchronized with heartbeat cycles of the subject, and are configured to generate image data having a reduced spatial resolution in the projection direction perpendicular to a preselected projection plane. A reduction factor F quantifies this reduced resolution, such that the number of data acquisition sequences provided within each heartbeat cycle is F times as many as a comparable imaging protocol that generates full-resolution data. The total scan time can be reduced by a factor of F with negligible degradation in the projection image quality.

20 Claims, 3 Drawing Sheets

(56) References Cited

U.S. PATENT DOCUMENTS

| | | | |
|---|---|---|---|
| 8,818,491 B2* | 8/2014 | Xu | A61B 5/055 600/410 |
| 2008/0183067 A1* | 7/2008 | Shu | G01R 33/4824 600/410 |
| 2012/0314909 A1 | 12/2012 | Edelman | |
| 2013/0063146 A1* | 3/2013 | Riederer | G01R 33/5611 324/309 |
| 2016/0169999 A1* | 6/2016 | Herza | A61B 5/055 600/411 |
| 2016/0274201 A1* | 9/2016 | Zhu | G01R 33/5635 |
| 2017/0076467 A1* | 3/2017 | Mistretta | G06T 7/2053 |
| 2017/0089997 A1* | 3/2017 | Jara | G01R 33/5601 |
| 2017/0108570 A1* | 4/2017 | Eichner | G01R 33/56545 |
| 2017/0123027 A1* | 5/2017 | Zuehlsdorff | G01R 33/3875 |
| 2017/0249758 A1* | 8/2017 | Mistretta | G06T 11/003 |
| 2017/0307714 A1* | 10/2017 | Okell | G01R 33/56366 |
| 2017/0343635 A1* | 11/2017 | Salerno | G01R 33/5601 |
| 2018/0031662 A1* | 2/2018 | Markl | G06T 7/20 |

OTHER PUBLICATIONS

Laub et al, syngo TWIST for Dynamic Time-Resovled MR Angiography.*

Chtzimavroudis, Clinical Blood Flow Quantification with Segmented k-Space Magnetic Rsonance Phase Velocity Mapping.*

M. Lustig et al., Compressed Sensing MR, IEEE Signal Processing Magazine (Mar. 2008), pp. 72-82, USA.

R.R. Edelman et al., Quiescent-Interval Single-Shot Unenhanced Magnetic Resonance Angiography of Peripheral Vascular Disease:Technical Considerations and Clinical Feasibility, Magnetic Resonance in Medicine 63:951-958 (2010), USA.

* cited by examiner

SYSTEM AND METHOD FOR ACCELERATED ANGIOGRAPHIC MAGNETIC RESONANCE IMAGING

FIELD OF THE DISCLOSURE

The present disclosure relates to a magnetic resonance imaging (MRI) system and method for angiographic imaging of vascular structures. More specifically, the present disclosure describes systems and methods that provide vascular maximum-intensity projection imaging with scan times that are shorter than those needed for conventional techniques.

BACKGROUND INFORMATION

Angiography is a field of medical imaging that focuses primarily on imaging of the lumen (interior) of blood vessels and heart chambers, as well as some other body organs. Such imaging can be helpful in diagnostic applications, e.g., to detect and identify vascular pathologies such as, e.g., stenosis (narrowing of a vessel), aneurysms (vessel wall dilatations that could rupture), and plaque or other abnormalities that may be present on interior walls of a vessel. For example, assessment of plaque morphology and composition in carotid vessels is clinically important for early detection of vulnerable plaque, monitoring the progression of atherosclerotic plaque, and response to treatment for such plaque.

Magnetic resonance (MR) imaging is a non-invasive imaging technique that is often effective for angiographic imaging. Magnetic resonance angiography ("MRA") uses the magnetic resonance phenomenon to produce images of the human vasculature. To enhance the diagnostic capability of MRA, a contrast agent such as gadolinium can be injected into the patient prior to the MRA scan. Such contrast enhanced ("CE") MRA methods are effective when the central k-space image data can be acquired over the short time interval when the bolus of contrast agent is flowing through the vasculature of interest. Collection of the central lines of k-space data during peak arterial enhancement, therefore, is important for obtaining high-quality images of a particular vascular region.

Other MRA techniques that do not require introduction of a contrast enhancement substance have also been developed. For example, time-of-flight (TOF) techniques, first introduced in the 1980s, can be used for 3D vascular imaging, primarily for intracranial circulation. Further, phase contrast (PC) techniques have been developed that utilize a change in the phase shifts of flowing protons in the region of interest to create an image. For example, two sets of image data can be obtained of a region of interest, with parameters for one image pulse sequence configured so the image is insensitive to flow. A second set of image data can be acquired that reflects proton spin phase changes along the direction of flow through applied magnetic field gradients. Subtracting the images reconstructed from these two data sets can yield an image that indicates flow changes, which are related to local flow velocities. A general summary of these and other MRA techniques are presented, e.g., in U.S. Patent Publication No. 2012/0314909 of Edelman, which is incorporated herein by reference in its entirety.

MR imaging can image 3D volumes of interest by obtaining image data for a plurality of parallel slices that fill the volume. A 2D image of each slice can be constructed based on the image intensity of each pixel within the plane defining a slice. Alternatively, image data representing the 3D volume can be obtained directly as an image intensity for each volume element (voxel) within the imaged volume. For either technique, the image resolution (e.g. pixel size and slice thickness for slice-based imaging, or voxel dimensions for 3D imaging) can be selected based on the image requirements. Such resolution is often selected as a compromise between spatial resolution and scan time required to obtain the image data. For example, a desired spatial resolution of the 3D image can be determined based on the size of arteries and veins of interest and the extent of the 3D volume being imaged, and may be specified prior to the start of an image acquisition scan.

For many clinical applications, an MRA-based diagnosis can be accomplished based on a 2D projection of the acquired image of a 3D volume, rather than on the full 3D volume image itself. Different types of projection images can be generated and assessed from a 3D image (or set of 3D image data). For angiographic imaging, a maximum intensity projection (MIP) image is often used. In this type of 2D projection, the imaged 3D volume is projected onto a 2D plane such that each pixel in the resulting 2D image represents the maximum intensity value (of the image data) in a line through the 3D image that is perpendicular to the 2D image plane at the pixel location.

To generate a MIP image from image data representing a 3D volume of interest, a particular viewing plane is first selected. MIP-based MR angiography applications typically use image projections within principal planes defined by three major axes of the human body. These orthogonal axes/directions are: anterior-posterior (A-P), head-foot (H-F), and left-right (L-R). Three viewing planes can be defined as the three planes orthogonal to these axes. An imaginary ray is then projected perpendicular to the particular viewing plane through the 3D image data set. The highest signal intensity of all voxels or pixels in the acquired 3D data set that lie along this ray is determined, and this intensity value is then assigned to the pixel in the viewing plane that the ray intersects. This procedure is repeated for every pixel in the viewing plane to create a maximum-intensity projection image.

MR image data can be degraded if there is motion during the scan time used to acquire the image data, such as breathing or other movement of the subject being imaged. MR imaging of the heart and/or vascular structures can be particularly affected by motion due to the unavoidable pulses that affect the vascular system through the heartbeat. Accordingly, cardiac and angiographic imaging often employ pulse sequences that are timed relative to a series of heartbeats, or "gated," to be active in the relatively motion-free intervals between heartbeats. Acquisition of data for a single image typically occurs over several heartbeat cycles. Nevertheless, shorter image data acquisition times are generally preferable to avoid introduction of motion artifacts, improve image quality, and reduce the scan time needed to obtain images.

Many techniques have been developed to date for accelerating MR image data acquisition, such as parallel imaging. Parallel imaging uses an array of RF coils in a known spatial array, where image data from the various coils can be sampled in parallel and the spatial relationships among the coils can provide a portion of the spatial encoding that is typically obtained using phase-encoding gradient fields.

Compressed sensing (CS) is another known MRI technique for speeding up MR data acquisition times by using a low sampling rate, e.g. a rate that is below the Nyquist sampling rate. CS techniques are based on the observation that many signals of interest (including MRI imaging signals) may have a sparse representation when using a particular transform. Accordingly, there may exist a particular transform space (a "sparsity space") for a given signal in which most of the transform coefficients are small or zero. Such small coefficients can be assumed to be zero without significant loss of signal quality (the sparseness assumption). Signal reconstruction can often be well-approximated by determining only the subset of large transform coefficients in the sparsity space, which can be much faster than using the entire spectrum of coefficients associated with other (non-sparse) transform spaces. An overview of using CS techniques for MR imaging is provided, e.g., in M. Lustig et al., *IEEE Signal Processing Magazine* (March 2008), pp. 72-82, which is incorporated herein by reference in its entirety.

Even with these acceleration techniques, further reduction in data acquisition times is desirable for angiographic imaging procedures. Accordingly, it would be desirable to have a system and method for magnetic resonance angiography that addresses some of the shortcomings described above, for example, which can provide even shorter scan times.

SUMMARY OF EXEMPLARY EMBODIMENTS

Exemplary embodiments of the present disclosure can provide systems and methods for 3D MR angiographic imaging with reduced scan times. Magnetic resonance image data can be obtained that is synchronized or coordinated with heartbeat cycles, e.g., using conventional gating techniques, such that portions of the image data (e.g., image data for individual slices) are obtained during the intervals between successive heartbeats. Image data for reconstruction of projected images can be obtained with reduced resolution in the projection direction without significant degradation in image quality.

In one embodiment, a magnetic resonance imaging system is provided that is configured to generate certain pulse sequences to obtain MR image data for a 3D volume to be imaged, where the image data is used to reconstruct a projected image on a predetermined plane. The projected image can be a maximum-intensity projection image. In other embodiments, the projected image can be a minimum-intensity projected image.

In accordance with embodiments of the present disclosure, an imaging plane can first be selected. In some embodiments, the projected image plane can be the A-P, H-F, or L-R plane. The imaging/projection plane can be selected, e.g., based on the vascular structures and/or region of the subject to be imaged. An imaging protocol for a 3D volume can then be modified to reduce the resolution in the projection direction by an integral "reduction factor" F, which represents a degree of reduction in the image data resolution in the direction perpendicular to the selected imaging plane.

In embodiments of the disclosure, "F" times as many image data acquisition sequences can be provided within each heartbeat cycle as compared to a comparable but unmodified imaging protocol (e.g., the "full-resolution" imaging protocol). The total number of heartbeat cycles (and thus total image acquisition or scan time) can be reduced by a factor of 1/F as compared to a conventional full-resolution image data acquisition procedure.

In one embodiment, a modified quiescent inflow single shot (QISS) technique can be used to obtain the angiographic image data to generate a MIP image. Each modified QISS sequence occurs in the period between successive heartbeats, and is used to obtain image data for a plurality of slices in the volume being imaged. The modified QISS sequence begins at a user-selected time interval following the R wave with an applied slice-selective saturation RF pulse and a background suppression RF pulse. Next there is a quiescent interval (QI), roughly coinciding with the period of rapid systolic arterial inflow, during which no RF pulses are applied.

After the QI, a plurality of data acquisition sequences are provided, with each data acquisition sequence optionally preceded by a fat saturation RF pulse. In some embodiments, the data acquisition sequence can be, e.g., a single-shot two-dimensional (2D) The MRI system of claim 11 steady-state free precession pulse sequence. The entire process is repeated for the next set of slices to be imaged, with the image data acquisition order for adjacent slices being sequential from bottom to top. The number of data acquisition sequences provided within each heartbeat cycle can be equal to F*N, where F is the reduction factor and N is the number of data acquisition sequences that can be provided in a corresponding but unmodified/full-resolution imaging protocol.

In some embodiments of the disclosure, the pulse sequence used to obtain image data can be a conventional 3D pulse sequence. In further embodiments, the pulse sequence can be a parallel-imaging sequence or a compressed-sensing sequence. In still further embodiments, the pulse sequence can be a simultaneous multi-slice (SMS) sequence, which can excite and obtain image data for a plurality of slices within each heartbeat cycle.

After the image data is acquired for the entire volume of interest, this image data can be used to reconstruct an MIP image in the selected projection plane.

In further embodiments, reduction factors F greater than 2 can be used to reduce image acquisition times even further. For example, if a factor F=3 is used, then the image resolution in the projection direction of MIP image can be reduced by a factor of 3 and three times as many modified data acquisition sequences can be provided as compared to the corresponding full-resolution imaging technique. In further embodiments, larger reduction factors F greater than 3, e.g., F=4 or F=5, may be used in certain embodiments, although the resulting images may be too degraded to be useful with these larger F factors. In still further embodiments, F may have a non-integer value.

Selection of a particular reduction factor for spatial resolution in the MIP direction can be based on, e.g., vascular size and tortuosity for the vascular structures of interest, and on the orientation of the selected projection plane for the MIP image to be reconstructed.

BRIEF DESCRIPTION OF THE DRAWINGS

Further objects, features and advantages of the present disclosure will become apparent from the following detailed description taken in conjunction with the accompanying figures showing illustrative embodiments, results and/or features of the exemplary embodiments of the present disclosure, in which.

While the present disclosure will now be described in detail with reference to the figures, it is done so in connection with the illustrative embodiments and is not limited by the particular embodiments illustrated in the figures. It is intended that changes and modifications can be made to the described embodiments without departing from the true scope and spirit of the present invention as defined by the appended claims.

DETAILED DESCRIPTION OF EXEMPLARY EMBODIMENTS

The present disclosure relates to methods and systems for providing vascular maximum-intensity projection (MIP) MR imaging with scan times that are shorter than those needed for conventional techniques. The process of generating a MIP image indicates that there is generally some redundancy in acquiring original MR image data with respect to the amount of data needed to reconstruct the projected images. Embodiments of the present disclosure provide systems and methods that can reduce such redundancy, thereby reducing overall image acquisition times without significant reduction in image quality.

Figure 1:
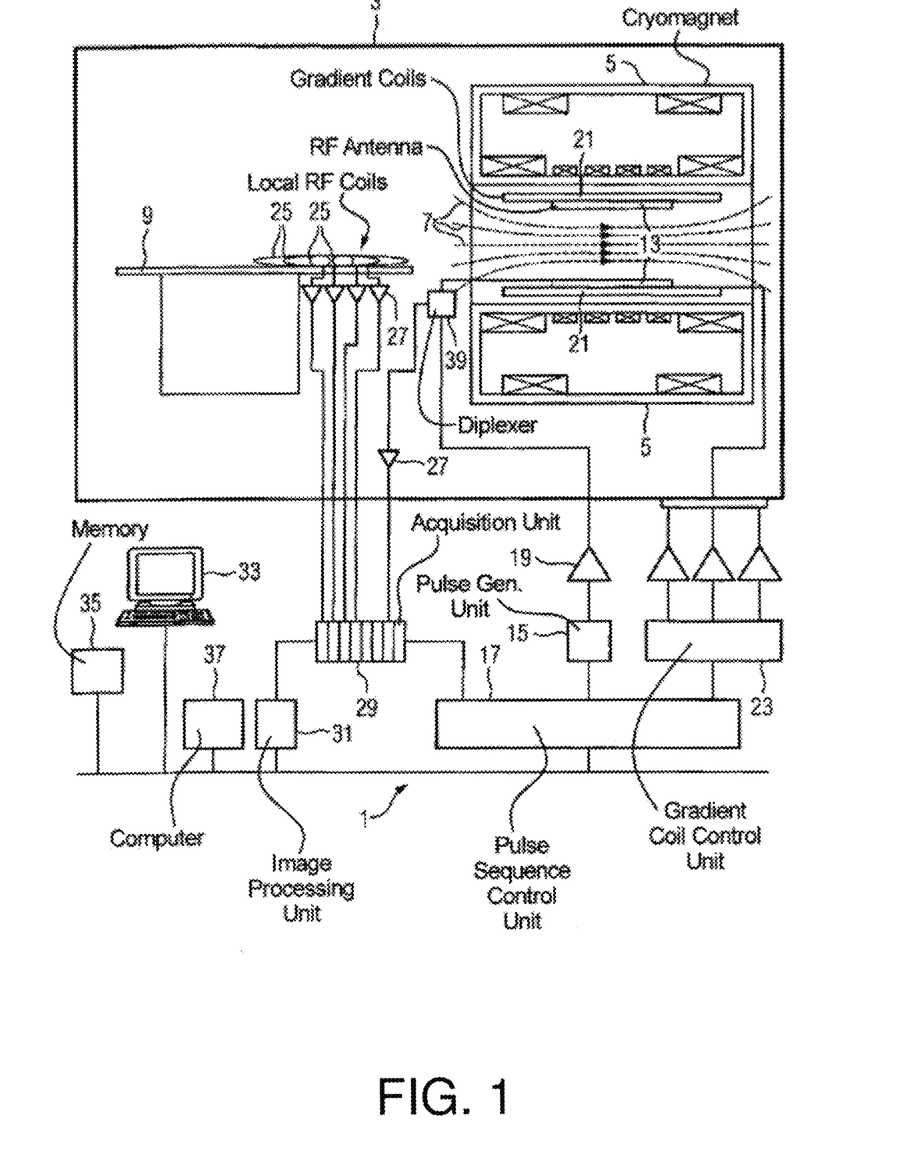
FIG. 1 schematically illustrates the basic components of a magnetic resonance imaging system constructed and operating in accordance with embodiments of the present disclosure.

FIG. 1 schematically shows the design of a magnetic resonance system 1 with certain components in accordance with embodiments of the present disclosure. The MR system 1 is configured, inter alia, to provide various magnetic fields tuned to one another as precisely as possible in terms of their temporal and spatial characteristics to facilitate examination of portions of a subject's body using magnetic resonance imaging techniques.

A strong magnet 5 (typically a cryomagnet) having a tunnel-shaped opening is provided in a radio-frequency (RF) shielded measurement chamber 3 to generate a static, strong base (or polarizing) magnetic field 7. The strength of the base magnetic field 7 is typically between 1 Tesla and 7 Tesla, although lower or higher field strengths can be provided in certain embodiments. A body or a body part to be examined (not shown) can be positioned within the substantially homogeneous region of the base magnetic field 7, e.g., provided on a patient bed 9.

Excitation of nuclear spins of certain atoms within the body can be provided via magnetic RF excitation pulses that are radiated using an RF antenna 13, such as a body coil. Other configurations of RF coils or antennas can also be provided in further embodiments, and such configurations may be adapted for particular portions of the subject anatomy to be imaged. The RF excitation pulses are generated by a pulse generation unit 15 that is controlled by a pulse sequence control unit 17.

After an amplification by a radio-frequency amplifier 19, the RF pulses are relayed to the RF antenna 13. The exemplary RF system shown in FIG. 1 is a schematic illustration, and particular configurations of the various components may vary from that illustrated in exemplary embodiments of the disclosure. For example, the MR system 1 can include a plurality of pulse generation units 15, a plurality of RF amplifiers 19, and/or a plurality of RF antennas 13 that may have different configurations depending on the body parts being imaged.

The magnetic resonance system 1 further includes gradient coils 21 that can provide directionally and temporally varied magnetic gradient fields for selective excitation and spatial encoding of the RF signals that are emitted and/or received by the RF antenna(s) 13. The gradient coils 21 are typically oriented along the three primary axes (x- y- and z-directions), although other or additional orientations may be used in certain embodiments. Pulsed current supplied to the gradient coils 21 can be controlled by a gradient coil control unit 23 that, like the pulse generation unit 15, is connected with the pulse sequence control unit 27. By controlling the pulsed current supplied to the gradient coils 21, transient gradient magnetic fields in the x-, y-, and z-directions can be superimposed on the static base magnetic field B0. This makes it possible to set and vary, for example, the directions and magnitudes of a slice gradient magnetic field Gs, a phase encode gradient magnetic field Ge, and a read (frequency encode) gradient magnetic field Gr, which can be synchronized with emission and detection of RF pulses. Such interactions between RF pulses and transient magnetic fields can provide spatially selective excitation and spatial encoding of RF signals.

A conventional gating arrangement (not shown) can be provided in communication with the pulse sequence control unit 27 to facilitate timing of sequences of RF pulses and magnetic field gradients with the subject's heartbeats such that image data can be obtained during the "quiet" intervals between heartbeats.

RF signals emitted by the excited nuclear spins can be detected by the RF antenna 13 and/or by local coils 25, amplified by associated radio-frequency preamplifiers 27, and processed further and digitized by an acquisition unit 29. In certain embodiments where a coil 13 (such as, for example, a body coil) can be operated both in transmission mode and in acquisition mode (e.g., it can be used to both emit RF excitation pulses and receive RF signals emitted by nuclear spins), the correct relaying of RF energy is regulated by an upstream transmission-reception diplexer 39.

An image processing unit 31 can generate one or more images based on the RF signals that represent image data. Such images can be presented to a user via an operator console 33 and/or be stored in a memory unit 35. A processor arrangement 37 can be provided in communication with the memory unit 35, and configured to execute computer-executable instructions stored in the memory unit 35 to control various individual system components. For example, the processor arrangement 37 can be configured by programmed instructions to control components such as, e.g., the gradient coil control unit 23, the pulse generation unit 15, and/or the pulse sequence control unit 27 to generate particular sequences of RF pulses and magnetic field variations, process and/or manipulate image data, etc., according to exemplary embodiments of the disclosure described herein.

Embodiments of the present disclosure can provide an MR imaging system 1, such as that shown in FIG. 1, which is configured to obtain angiographic image data for a 3D volume of interest in scan times that are shorter than those obtained using conventional techniques. The MR system 1 can be further configured to process the resulting image data to generate angiographic MIP images in one or more projection planes.

In some embodiments, the projected image is a maximum-intensity projection image. In certain embodiments, the projected image can be reconstructed based on a minimum intensity along the projection direction. The minimum intensity image may be preferable, e.g., when certain imaging parameters are used that result in features of interest exhibiting a reduced signal intensity. For example, a minimum intensity projection could be advantageous for the visualization of vascular calcifications, which typically appear dark in magnetic resonance images.

In accordance with embodiments of the present disclosure, an imaging plane can first be selected. This imaging (or projection) plane can be selected, e.g., based on the general orientation(s) of the vascular structures to be imaged. For example, the projection plane can be the A-P, H-F, or L-R plane. The pulse/field sequence is then configured to reduce the spatial resolution of the 3D MR image data by an integral "reduction factor" F in the direction perpendicular to the selected imaging plane, as described in more detail below. This reduction in spatial resolution in one direction can reduce the total acquisition time for the image data by the same factor.

Figure 2A:
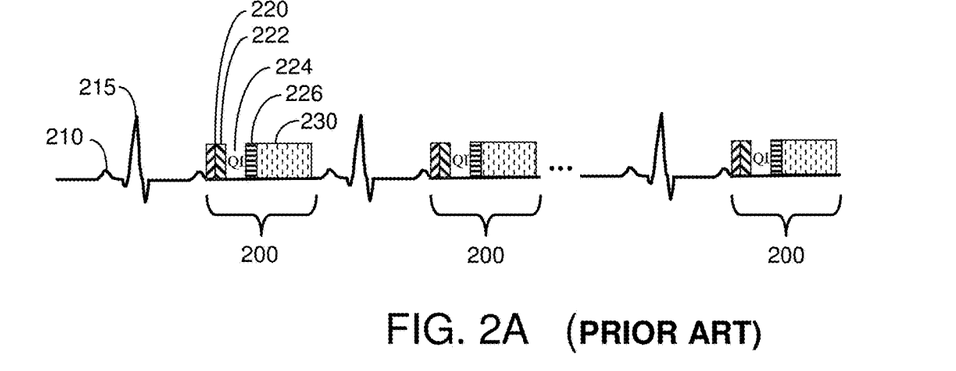
FIG. 2A is a schematic illustration of conventional QISS imaging sequences that can be used to obtain angiographic MR image data for maximum-intensity projection (MIP) images.

In one embodiment, a quiescent inflow single shot (QISS) technique can be used to obtain the angiographic image data to generate a MIP image. The QISS technique does not require injection of a contrast agent into the subject for imaging vascular structures. Exemplary prior-art QISS sequences 200 for angiographic imaging are shown in FIG. 2A. This figure schematically illustrates the QISS pulse sequences 200 for three heartbeat cycles; the cardiac cycles are shown as a dark horizontal line 210 with heartbeats (R waves) 215 indicated by the vertical spikes of this line. Each QISS sequence 200 occurs in the period between heartbeats, as shown in FIG. 2A, and is used to obtain image data for a particular slice in the volume being imaged. This timing of the QISS sequences 200 between heartbeats 215 can be achieved using conventional gating techniques, such as an electrocardiogram (ECG) gating technique.

A QISS sequence 200 begins at a user-selected time interval following the R wave 215. A slice-selective saturation RF pulse 220 is applied to the slice being imaged to set the longitudinal magnetization of tissues within the slice to zero, e.g., to suppress signals from muscle tissue. A background suppression RF pulse 222 is then applied cranially or caudally with respect to the imaged slice, e.g., to suppress signals from venous blood. Next there is a quiescent interval (QI) 224, roughly coinciding with the period of rapid systolic arterial inflow, during which no RF pulses are applied.

A chemical shift-selective fat saturation RF pulse 226 is applied after the QI 224, followed by a data acquisition sequence 230. The data acquisition sequence 230 can be, e.g., a single-shot two-dimensional The MRI system of claim 11 steady-state free precession pulse sequence, which may be used to image arterial spins within the slice during diastole, when flow is slow or absent. The entire process is repeated for the next slice to be imaged, with the image data acquisition order for adjacent slices being sequential from bottom to top, or from top to bottom, depending on the patient orientation and vessel bed being imaged.

Signal contrast in the prior-art QISS technique is based on a maximal inflow of unsuppressed blood into the imaging slice. Accordingly, the QISS sequences 200 need to be synchronized with the heartbeats as shown, e.g., in FIG. 2A. Image data for each slice is acquired after application of radiofrequency (RF) pulses 220, 222 to suppress signals from veins and background muscle. Such unsuppressed blood flows into the slice being imaged during the quiescent interval 224, and no pulses are applied during the QI. Following the QI, a fat suppression pulse 226 is provided and image data from a single slice is acquired, yielding a high signal from artery and low signal from other tissues in the slice. This image acquisition process is then repeated until the entire vascular volume of interest is acquired. Further details of the QISS technique for angiographic MR imaging are described, e.g., in R. R. Edelman et al., *Magnetic Resonance in Medicine* 63:951-958 (2010), which is incorporated herein by reference in its entirety.

Other imaging techniques can be used in further embodiments of the disclosure. For example, parallel imaging techniques, compressed sensing techniques, and the like can also be used to generate image data. In general, such imaging techniques can be adapted as described herein to provide more rapid data acquisition sequences by reducing the duration of the data acquisition sequence 230 while reducing the loss of spatial resolution in the projection direction.

In some embodiments, one slice of image data can be obtained per heartbeat cycle. In further embodiments, conventional simultaneous multi-slice (SMS) excitation, in which multiple slices are excited at the same time, can be used to acquire more sections/slices of imaging data within each heartbeat period. In still further embodiments, various 3D imaging techniques can be used with the methods and apparatus described herein.

Figure 2B:
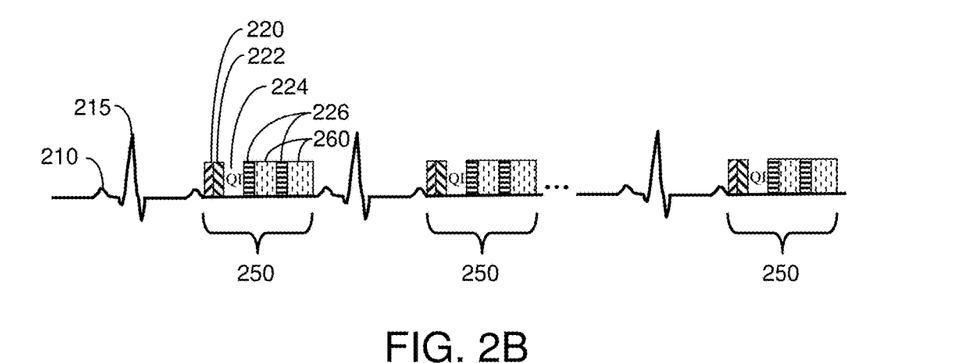
FIG. 2B is a schematic illustration of modified QISS imaging sequences in accordance with embodiments of the present disclosure, which can be used to reduce image data acquisition times with negligible reduction in quality of MIP images.

Exemplary sequences 250 for angiographic imaging in accordance with embodiments of the present disclosure are shown in FIG. 2B. This figure schematically illustrates modified QISS pulse sequences 250 for three heartbeat cycles, with overall timing similar to that shown for the prior-art QISS sequence shown in FIG. 2A.

In this example, the exemplary modified QISS sequences 250 can be used for peripheral angiography, where a preferred projection of 3D volume images is on the A-P plane (e.g., a coronal MIP where the image data is 'collapsed' in the A-P direction). Accordingly, the spatial resolution of the image can be reduced in the A-P direction by a particular reduction factor F. The exemplary image acquisition sequences 250 shown in FIG. 2B have a reduction factor F=2 in the A-P direction, as described below, which also reduces the total slice data acquisition time (e.g. scan time) by that same factor. In certain embodiments, the reduction factor F may have a non-integer (e.g., a fractional) value.

Similar to the prior-art QISS sequence 200 shown in FIG. 2A, the modified QISS sequence 250 shown in FIG. 2B begins with a slice-selective saturation RF pulse 220 and a venous (background) suppression RF pulse 222 following the R wave 215. The quiescent interval (QI) 224 follows these two RF pulses 220, 222. However, because the image resolution is reduced by a factor of 2 in the A-P direction, the modified data acquisition sequence 260 can be executed in half the time of the conventional data acquisition sequence 230 shown in FIG. 2A.

The extra time now available within each heart-beat cycle can be used to acquire image data for an additional slice. Accordingly, two modified (e.g., reduced-resolution) data acquisition sequences 260 can be provided following each quiescent interval 224. A fat saturation RF pulse 226 is preferably applied immediately prior to each modified data acquisition sequence 260. Accordingly, this exemplary scheme enables acquisition of image data for the entire volume of interest in N/2 heart-beats, as compared to a duration of N heartbeats for the conventional QISS sequence shown in FIG. 2A.

After the image data is acquired for the entire volume of interest, the MIP image in the selected projection plane can be constructed as described herein, e.g., using the image processing unit 31 of the MRI system 1. This MIP image can then be used for diagnostic purposes and the like.

Figure 3A:
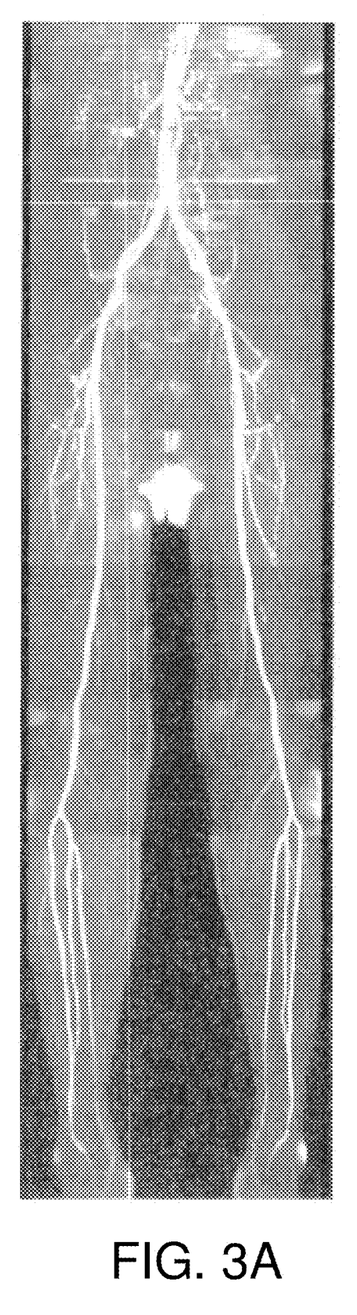
FIGS. 3A and 3B are exemplary full-thickness anteroposterior MIP images acquired with the imaging sequences shown in FIGS. 2A and 2B, respectively.
Figure 3B:
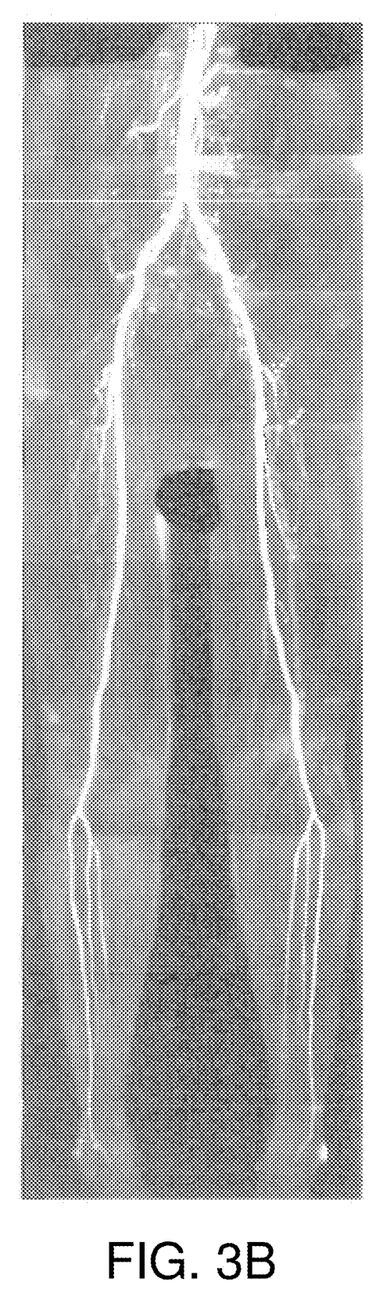

FIGS. 3A and 3B show exemplary full-thickness antero-posterior maximum intensity projection (MIP) MR images. The image in FIG. 3A was acquired with a conventional QISS sequence 200 as shown in FIG. 2A, and the image shown in FIG. 3B was obtained using a modified QISS sequence 250 as shown in FIG. 2B, respectively. The optimized QISS pulse sequence for rapid scanning of the lower extremities used the following imaging parameters: TR was 3.0 ms; echo time was 1.4 ms; QI was 228 ms; flip angle was 90°; time delay was 100 ms; effective slice thickness was 2.4 mm (3.0 mm with 0.6 mm overlap); parallel acceleration factor was 2; bandwidth was 676-694 Hz/pixel; flip angle for the fat suppression pulse was 135°. The acquisition matrix ranged from 352-400, depending on field of view (34-40 cm), maintaining in-plane spatial resolution at 1 mm (interpolated to 0.5 mm). Eight groups of 60 slices were acquired to span the peripheral arteries from the level of the distal aorta to the pedal arteries. For a subject heart rate of about 60 beats/min, the scan time was 1 min per slice group, so that total scan time was approximately 8 min.

A comparison of FIGS. 3A and 3B suggests that the image in FIG. 3B, which was obtained in accordance with embodiments of the present disclosure, exhibits negligible loss of image quality as compared to the image in FIG. 3A that was obtained using conventional techniques. A comparison of the respective pulse sequences in FIGS. 2A and 2B that were used to obtain these images indicates that the total image acquisition time was cut in half for the image shown in FIG. 3B as compared to the image in FIG. 3A, because there are two data acquisition sequences 260 provided in each sequence 250 (e.g. within each heart beat period) in FIG. 2B, and only a single data acquisition sequence 230 in each sequence 200 in FIG. 2A.

Certain imaging protocols may be configured to obtain full-resolution image data for N slices within a single heartbeat cycle. For example, the exemplary unmodified QISS pulse sequence shown in FIG. 2A obtains data for a single slice between successive heartbeats (N=1). In further embodiments of the present disclosure, the number of data acquisition sequences provided within each heartbeat cycle can be equal to F*N, where F is the reduction factor and N is the number of data acquisition sequences that can be provided in an unmodified/full-resolution imaging protocol. Accordingly, even when using faster imaging protocols that can generate data for multiple slices within a heartbeat cycle, reducing the resolution in the projection direction can facilitate generation of F times as many slices in the same time interval, thereby obtaining the full set of image data in 1/F amount of time needed for the full-resolution 3D imaging procedure.

In further embodiments, a reduction factor F greater than 2 can be used to reduce image acquisition times even further. For example, if a factor F=3 is used, then the image resolution in the projection direction of MIP image can be reduced by a factor of 3 and three modified data acquisition sequences 260 can be provided following each quiescent interval 224 within each heartbeat cycle. A fat saturation RF pulse 226 can again be applied prior to each modified data acquisition sequence 260. This example would require only ⅓ of the heartbeat cycles as compared to a conventional QISS technique, and the total image acquisition time would be reduced by a corresponding factor of 3 (i.e., the image data could be acquired in ⅓ of the time). Larger reduction factors F, e.g. F=4 or F=5, may be used in certain embodiments, although the resulting images may be too degraded to be useful when larger F values (lower resolutions) are used to image certain volumes.

Selection of a particular reduction factor for spatial resolution in the MIP direction can be based on, e.g., vascular size and tortuosity for the vascular structures of interest and on the particular projection plane selected. For example, when imaging peripheral vascular structures in feet, it has been observed that a reduction factor of 2 can be used with no perceptible degradation of image quality. In principle, the reduction factor can be larger (e.g. more aggressive) when imaging anatomical regions where there are fewer vessels in close proximity along the projection direction of the MIP image. In such cases, the overall scan time can be reduced by a greater factor.

The foregoing merely illustrates the principles of the present disclosure. Various modifications and alterations to the described embodiments will be apparent to those skilled in the art in view of the teachings herein. It will thus be appreciated that those skilled in the art will be able to devise numerous techniques which, although not explicitly described herein, embody the principles of the present disclosure and are thus within the spirit and scope of the present disclosure.

What is claimed is:

1. A method for providing a projection image of vascular structures in a 3D volume of a subject using a magnetic resonance (MR) system, comprising the steps of:
   (a) selecting a projection plane;
   (b) generating an image data set for the 3D volume using a plurality of imaging pulse sequences, wherein:
      (i) each imaging pulse sequence is provided during an interval between successive heartbeats of the subject;
      (ii) each imaging pulse sequence comprises a plurality of data acquisition sequences;
      (iii) each imaging pulse sequence is configured to generate image data having a spatial resolution that is reduced by a factor F in a direction perpendicular to the projection plane;
      (iv) each imaging pulse sequence comprises F times as many data acquisition sequences as a corresponding imaging pulse sequence that is configured to generate image data having an unreduced spatial resolution in the direction perpendicular to the projection plane; and
   (c) generating the projection image in the selected projection plane based on the image data set.

2. The method of claim 1, wherein each of the plurality of data acquisition sequences is preceded by a fat suppression sequence.

3. The method of claim 1, wherein the factor F is equal to 2.

4. The method of claim 1, wherein the factor F is equal to 3.

5. The method of claim 1, wherein the factor F is greater than 3.

6. The method of claim 1, wherein each imaging pulse sequence comprises a quiescent inflow single-shot (QISS) sequence.

7. The method of claim 1, wherein each imaging pulse sequence comprises a simultaneous multi-slice (SMS) sequence.

8. The method of claim 1, wherein each imaging pulse sequence comprises at least one of a parallel imaging sequence and a compressed sensing sequence.

9. The method of claim 1, wherein the projection plane is at least one of an anterior-posterior (A-P) plane, a head-foot (H-F) plane, and a left-right (L-R) plane.

10. The method of claim 1, wherein each of the plurality of data acquisition sequences comprises a single-shot 2D steady-state free precession sequence.

11. An MRI system for providing a projection image of vascular structures in a 3D volume of a subject, comprising:
  a radio frequency (RF) signal generator and a magnetic field gradient generator which are together configured to provide an imaging protocol comprising a plurality of imaging pulse sequences that further comprise a plurality of RF pulse sequences and magnetic field gradient sequences for acquisition of image data for the 3D volume;
  a gating arrangement configured to synchronize the imaging pulse sequences with heartbeat intervals of the subject; and
  an image processing unit configured to generate the projection image based on the image data,
wherein:
  (i) each imaging pulse sequence is provided during a separate heartbeat interval of the subject;
  (ii) each imaging pulse sequence comprises a plurality of data acquisition sequences;
  (iii) each imaging pulse sequence is configured to generate image data having a spatial resolution that is reduced by a factor F in a direction perpendicular to the projection plane; and
  (iv) each imaging pulse sequence comprises F times as many data acquisition sequences as a corresponding imaging pulse sequence that is configured to generate image data having an unreduced spatial resolution in the direction perpendicular to the projection plane.

12. The MRI system of claim 1, wherein each of the plurality of data acquisition sequences is preceded by a fat suppression sequence.

13. The MRI system of claim 11, wherein the factor F is equal to 2.

14. The MRI system of claim 11, wherein the factor F is equal to 3.

15. The MRI system of claim 11, wherein the factor F is greater than 3.

16. The MRI system of claim 11, wherein each imaging pulse sequence comprises a quiescent inflow single-shot (QISS) sequence.

17. The MRI system of claim 11, wherein each imaging pulse sequence comprises a simultaneous multi-slice (SMS) sequence.

18. The MRI system of claim 11, wherein each imaging pulse sequence comprises at least one of a parallel imaging sequence and a compressed sensing sequence.

19. The MRI system of claim 11, wherein the projection plane is at least one of an anterior-posterior (A-P) plane, a head-foot (H-F) plane, and a left-right (L-R) plane.

20. The MRI system of claim 11, wherein each of the plurality of data acquisition sequences comprises a single-shot 2D The MRI system of claim 11 steady-state free precession sequence.

* * * * *